United States Patent
Maguire-Boyle et al.

(10) Patent No.: US 10,302,973 B2
(45) Date of Patent: May 28, 2019

(54) SPECTRALLY PROGRAMMABLE MEMRISTOR

(71) Applicant: Halliburton Energy Services, Inc., Houston, TX (US)

(72) Inventors: Samuel James Maguire-Boyle, Houston, TX (US); Aditya B. Nayak, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/559,333

(22) PCT Filed: Apr. 23, 2015

(86) PCT No.: PCT/US2015/027331
§ 371 (c)(1),
(2) Date: Sep. 18, 2017

(87) PCT Pub. No.: WO2016/171701
PCT Pub. Date: Oct. 27, 2016

(65) Prior Publication Data
US 2018/0113330 A1 Apr. 26, 2018

(51) Int. Cl.
| | |
|---|---|
| *G06K 7/14* | (2006.01) |
| *G02F 1/01* | (2006.01) |
| *G11C 13/00* | (2006.01) |
| *G11C 13/04* | (2006.01) |
| *G02F 3/02* | (2006.01) |

(Continued)

(52) U.S. Cl.
CPC ............ *G02F 1/011* (2013.01); *G02F 1/0121* (2013.01); *G02F 1/0356* (2013.01); *G02F 1/091* (2013.01); *G02F 3/02* (2013.01); *G11C 13/0007* (2013.01); *G11C 13/0069* (2013.01); *G11C 13/04* (2013.01); *G02F 2202/10* (2013.01)

(58) Field of Classification Search
CPC .. G11C 11/16; G11C 11/1675; G11C 13/0069
USPC ......... 365/148, 158, 209; 235/487, 492, 454
See application file for complete search history.

(56) References Cited

U.S. PATENT DOCUMENTS

| | | |
|---|---|---|
| 3,801,966 A | 4/1974 | Terao |
| 7,580,596 B1 | 8/2009 | Meijer et al. |

(Continued)

FOREIGN PATENT DOCUMENTS

| | | |
|---|---|---|
| KR | 10-2013-0065093 A | 6/2013 |
| WO | WO 2011/028208 A1 | 3/2011 |

OTHER PUBLICATIONS

International Search Report and the Written Opinion of the International Search Authority, or the Declaration, dated Jan. 21, 2016, PCT/US2015/027331, 14 pages, ISA/KR.

(Continued)

*Primary Examiner* — Jamara A Franklin
(74) *Attorney, Agent, or Firm* — Haynes and Boone, LLP

(57) ABSTRACT

A memristor element is used to create a spectrally programmable optical device. An electromagnetic field is applied across the memristor element in order to alter its spectral properties. In turn, the spectral properties of the electromagnetic radiation optically interacting with the memristor element are also altered. This alteration in spectral properties allows the memristor to be "programmed" to achieve a variety of transmission/reflection/absorption functions.

20 Claims, 3 Drawing Sheets

(51) Int. Cl.
  *G02F 1/035* (2006.01)
  *G02F 1/09* (2006.01)

(56) References Cited

U.S. PATENT DOCUMENTS

| | | |
|---|---|---|
| 7,596,016 B2 | 9/2009 | Johnson |
| 7,768,815 B2 | 8/2010 | Chen et al. |
| 8,081,129 B1 * | 12/2011 | Santori ............... H01Q 1/2225 343/745 |
| 8,280,054 B2 | 10/2012 | Bratkovski |
| 8,395,191 B2 | 3/2013 | Or-Bach et al. |
| 8,440,542 B2 | 5/2013 | Sekar et al. |
| 8,477,408 B2 | 7/2013 | Li |
| 8,542,518 B2 | 9/2013 | Bratkovski et al. |
| 8,546,785 B2 | 10/2013 | Yang et al. |
| 8,557,632 B1 | 10/2013 | Or-Bach et al. |
| 8,575,585 B2 | 11/2013 | Yang et al. |
| 8,605,483 B2 | 12/2013 | Williams et al. |
| 8,609,459 B2 | 12/2013 | Wen et al. |
| 8,614,432 B2 | 12/2013 | Pickett et al. |
| 8,735,863 B2 | 5/2014 | Fowler et al. |
| 8,773,167 B2 | 7/2014 | Robinett et al. |
| 9,847,129 B2 * | 12/2017 | Buchanan .......... G11C 13/0069 |
| 2005/0221473 A1 | 10/2005 | Dubin et al. |
| 2010/0253997 A1 | 10/2010 | Li |
| 2010/0278474 A1 | 11/2010 | Beausoleil et al. |
| 2012/0012809 A1 | 1/2012 | Yang et al. |
| 2012/0154880 A1 | 6/2012 | Wu et al. |
| 2012/0281980 A1 | 11/2012 | Cho et al. |
| 2013/0095580 A1 | 4/2013 | Or-Bach et al. |
| 2013/0235651 A1 | 9/2013 | Perner et al. |
| 2014/0027702 A1 | 1/2014 | Lu et al. |
| 2014/0291602 A1 | 10/2014 | Kenyon et al. |

OTHER PUBLICATIONS

Kavehei et al., "The Fourth Element: Characteristics, Modelling and Electromagnetic Theory of the Memristor," *Proceedings of the Royal Society of London A: Mathematical, Physical and Engineering Sciences*, p. rspa20090553. The Royal Society, Mar. 17, 2010.

Strukov et al., "Hybrid CMOS/Memristor Circuits," *Circuits and Systems (ISCAS), Proceedings of 2010 IEEE International Symposium*, pp. 1967-1970, May 30, 2010.

* cited by examiner

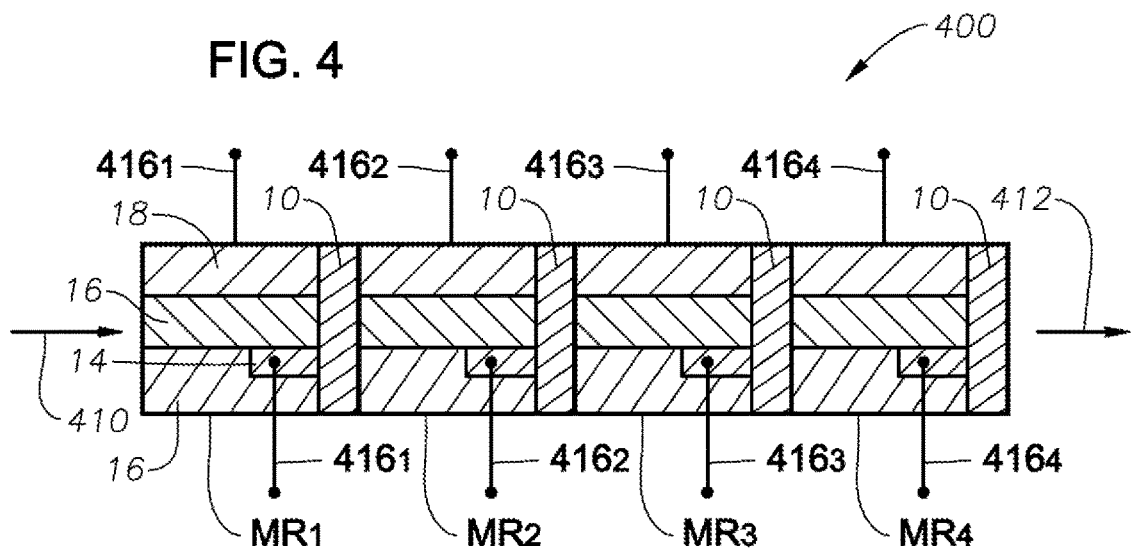
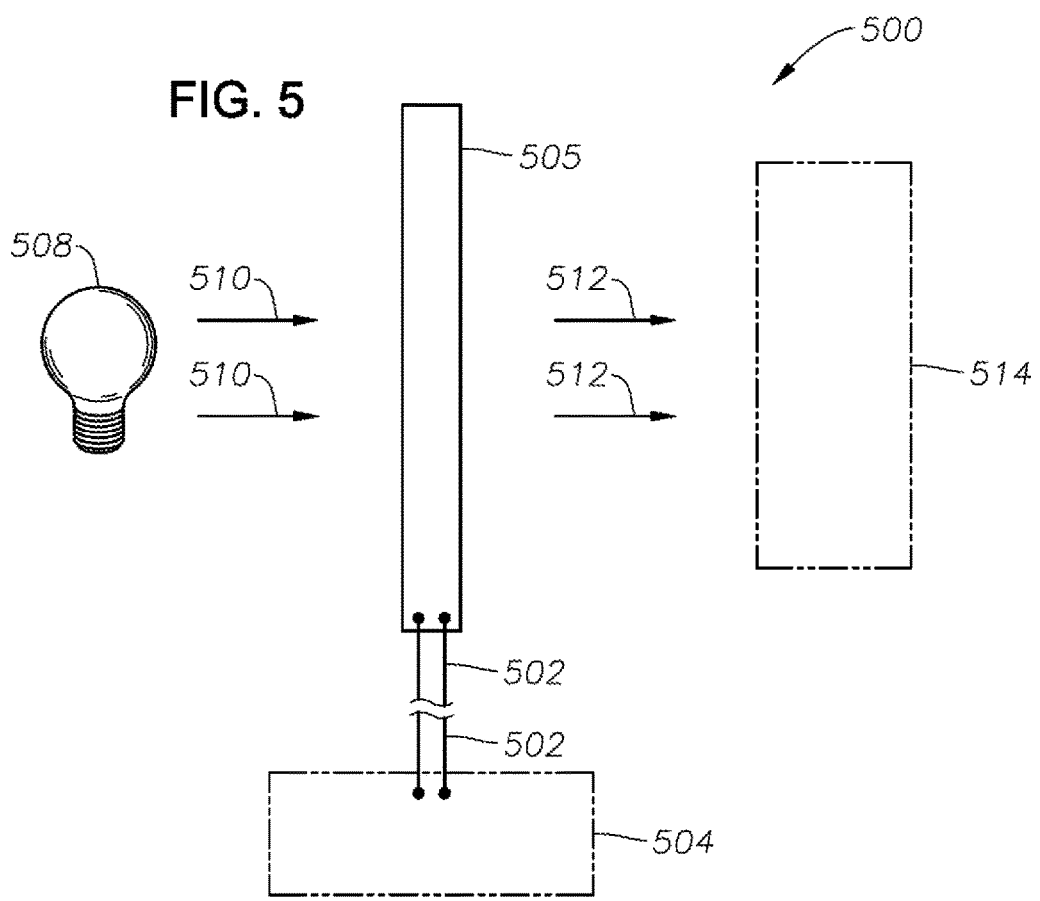

SPECTRALLY PROGRAMMABLE MEMRISTOR

PRIORITY

The present application is a U.S. National Stage patent application of International Patent Application No. PCT/US2015/027331, filed on Apr. 23, 2015, the benefit of which is claimed and the disclosure of which is incorporated herein by reference in its entirety.

FIELD OF THE DISCLOSURE

Embodiments of present disclosure generally relates to optics and, more particularly, to a spectrally programmable memristor-based optical device and method.

BACKGROUND

In recent years, optical analysis techniques have been developed for a number of applications. Some of these techniques employ the use of a thin-film optical interference element, also known as a multivariate optical element ("MOE"). In general, these techniques optically interact electromagnetic radiation (e.g., from a sample) with the MOE, wherein the output reflects the measured intensity of the electromagnetic radiation. The measured intensity may then be utilized in a number of applications, such as, for example, sensors.

Historically, such thin-film optical elements have been designed and fabricated using alternating layers of high-index and low-index materials deposited on a substrate. Once the materials have been deposited on the substrate, however, the transmission/reflection/absorption functions of the thin-film optical element are fixed due to the fundamental nature of the design and fabrication process. Therefore, once the film stack has been deposited, its spectral properties cannot be changed.

BRIEF DESCRIPTION OF THE DRAWINGS

FIG. 4 is a block diagrammatical illustration of a memristor element array, according to an alternative embodiment of the present disclosure; and FIG. 5 illustrates a spectrally programmable optical device 500, according to a generalized embodiment of the present disclosure.

DESCRIPTION OF ILLUSTRATIVE EMBODIMENTS

Figure 1:
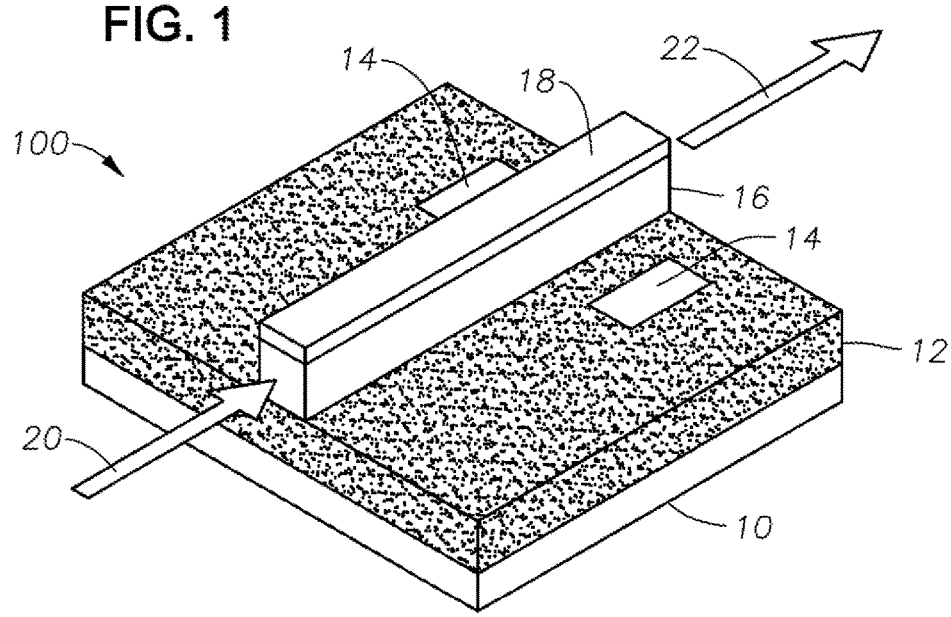
FIG. 1 illustrates a memristor element which may be utilized in a spectrally programmable optical thin-film device in transmission mode, according to certain illustrative embodiments of the present disclosure.

Illustrative embodiments and related methods of the present disclosure are described below as they might be employed in a spectrally programmable memristor-based optical device. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, the present disclosure is directed to an optical device which uses a memristor element to create a spectrally programmable optical device. A memristor, or "memory resistor," is a non-linear electrical component in which its resistance is related to the electrical voltage applied across it. In a generalized embodiment of the present disclosure, electromagnetic radiation optically interacts with a memristor element made of spectrally alterable material. An electromagnetic field is applied across the memristor element in order to alter its spectral properties. In turn, the spectral properties of the electromagnetic radiation optically interacting with the memristor element are also altered. This alteration in spectral properties allows the memristor to be "programmed" to achieve a variety of transmission/reflection/absorption functions. As a result, the memristor-based devices of the present disclosure may be utilized in a variety of applications, including, for example, multi-functional optical sensors.

As previously mentioned, thin-film optical elements have been designed and fabricated using alternating layers of high-index and low-index materials deposited on a substrate. The fundamental equations governing the transmission, reflection and absorption functions of thin-film optical elements are the Fresnel equations, derived from Maxwell's equations. The choice of materials is based on the application and the range of wavelengths of interest. As an example, for an infrared application, one might choose a-Si (Amorphous Silicon) as the high index material, $SiO_2$ (Silicon-dioxide) as the low index material and glass as the substrate. The fabrication methods typically include PVD (Physical Vapor Deposition such as, for example, electron-beam vacuum deposition, RF magnetron sputtering, etc.), CVD (Chemical Vapor Deposition, such as MOCVD, PECVD etc.), ALD (Atomic Layer Deposition), etc.

As also mentioned, illustrative embodiments of the present disclosure utilize spectrally programmable memristor elements. The memristor elements are non-linear electrical components relating electrical charge and magnetic flux. The fundamental equation that governs the linkage of electrical charge (q) and magnetic flux ($\Phi$) is shown as:

$$d\Phi = Mdq \quad \text{Eq.(1)},$$

also known as the circuit theory equation for a memristor. In Equation 1, $\Phi$ is the magnetic flux, M is the resistance of the memristor, and q is the charge. Accordingly, this type of device shows relationship between the resistance and electrical voltage applied across the memristor element.

FIG. 1 illustrates a memristor element which may be utilized in a spectrally programmable optical thin-film device in transmission mode, according to certain illustrative embodiments of the present disclosure. In a generalized embodiment, the fundamental component of the device is a memristor element 100, as shown in FIG. 1. In this example, memristor element 100 is a single memristor pixel as shown; however, in other embodiments, the memristor element may be comprised of a plurality of memristor pixels. "Memristor pixel" refers to a single memristor. Nevertheless, memristor element 100 consists of a metal/semiconductor interface comprised of an insulator/dielectric layer 10, pure semiconductor layer 12 having metal contacts 14 positioned thereon, semiconductor layer 16 having defects therein, and a metal layer 18. The "defects" in semiconductor layer 16 refers to non-pure semiconductors with defects in the crystal lattice which may be manufactured in a variety of ways. In other embodiments however, the same functionality can be achieved by a dielectric/semiconductor interface or a metal/metal-oxide interface.

In certain embodiments, the metal/semiconductor interface can be fabricated using standard processing techniques, such as, for example, PVD, CVD or ALD. Semiconductor layer 16 is deposited with a high level of defects present in the crystal lattice of the material such that diffusion of metal ions can occur when electromagnetic radiation (e.g., an electrical voltage) is applied across the device via metal layer 18 and contacts 14. Selection of the metal, semiconductor, defect level, etc., will depend on the application and the range of wavelengths of interest.

Still referencing FIG. 1, as electromagnetic radiation 20 enters defect ridden semiconductor layer 16, layer 16 acts as a waveguide, attenuating electromagnetic radiation 20 as it passes through it, resulting in the output of optically-interacted light 22. When an electromagnetic wave is produced across semiconductor layer 16, metal ions diffuse into defect ridden semiconductor layer 16 (the fundamental mechanism is similar to semiconductor doping). The electromagnetic wave may be produced in a variety of ways, such as, for example, a voltage or current applied across semiconductor layer 16. Nevertheless, the number of metal ions from metal layer 18 diffusing into semiconductor layer 16 increases with an increase in the power level of the electromagnetic wave(s), thus resulting in a decrease in electromagnetic radiation passing through layer 16. The amount of electromagnetic radiation 20 passing through the semiconductor layer 16 increases with a decrease in the power level of the electromagnetic wave(s). This phenomena occurs due to scattering and absorption effects caused by the metal ions diffused into semiconductor layer 16. Accordingly, semiconductor layer 16 can also be referred to as "spectrally alterable material."

Figure 2:
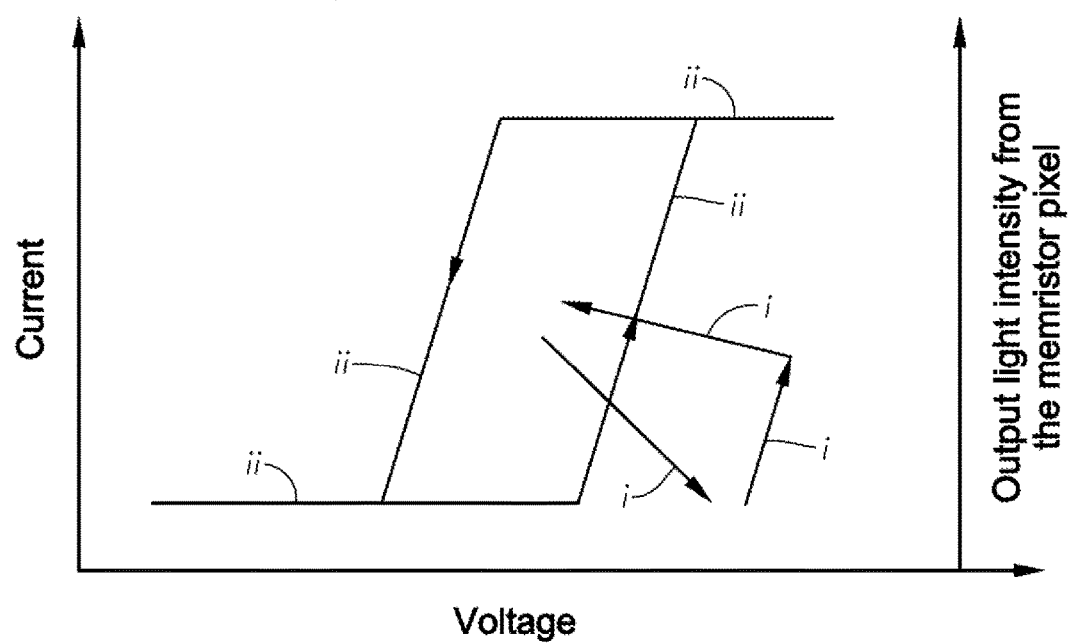
FIG. 2 is a graph which plots the voltage-current hysteresis and output light intensity of a memristor element having one pixel, according to certain illustrative embodiments of the present disclosure.

As previously mentioned, memristor element 100 is comprised of a single pixel, but in other embodiments memristor element 100 may be comprised of a plurality of pixels. FIG. 2 is a graph which plots the voltage-current hysteresis and output light intensity of a memristor element having one pixel, according to certain illustrative embodiments of the present disclosure. The voltage-current hysteresis (ii) of the memristor element is plotted relative to the output light intensity (i). By using the hysteresis curve, the % transmission of electromagnetic radiation through the defect ridden semiconductor layer may be controlled. Such a plot may be used to calibrate the memristor element so that the required amount of electromagnetic energy (e.g., voltage, current, etc.) is applied across each pixel to produce the desired spectral output. Once the voltage/optical transmission relationship across all wavelengths is known for the memristor element, it can be 'programmed' to achieve any transmission/reflection/absorption function.

Still referencing FIG. 1, although not shown, an electromagnetic field producing element is communicably coupled to contacts 14 and metal layer 18 in order to produce the electromagnetic field(s) across semiconductor layer 16. The electromagnetic field producing element may be communicably coupled in a number of ways, such as, for example, via a wired or wireless connection. When wireless methods are utilized, contacts 14 may not be necessary. The electromagnetic field producing element may be a variety of devices, such as, for example, a current source, voltage source, electromagnetic source, magnetic source, thermal source or an ionic source. Regardless of the source used, the result is the diffusion of metal ions into defect ridden semiconductor layer 16 which, in turn, affects the spectral output of memristor element 100.

Figure 3A:
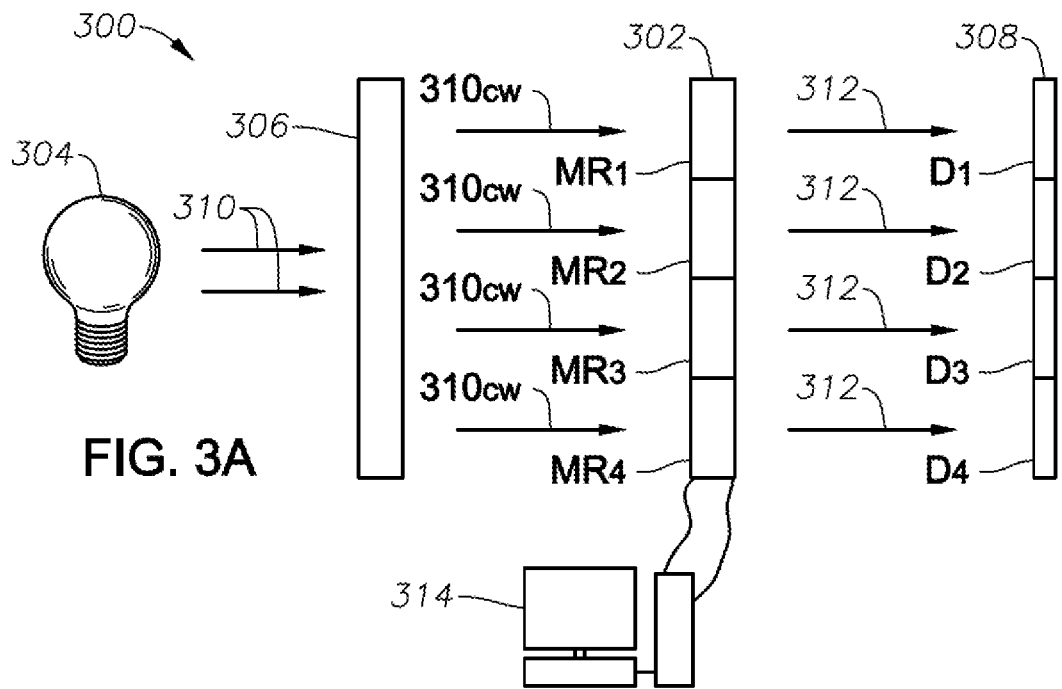
FIG. 3A is a block diagrammatical illustration of a spectrally programmable memristor array in calibration mode, according to certain illustrative embodiments of the present disclosure.

FIG. 3A is a block diagrammatical illustration of a spectrally programmable memristor array in calibration mode, according to certain illustrative embodiments of the present disclosure. Calibration system 300 includes the memristor element 302, which itself is comprised of a memristor array that includes four memristor elements $MR_1$, $MR_2$, $MR_3$ and $MR_4$. Each memristor element $MR_1 \ldots MR_4$ may be made of one or more pixels. Calibration system 300 includes an electromagnetic source 304 (selected based upon the desired application) which produces electromagnetic radiation 310, optical separation device 306, and memristor element array 302 fabricated such that memristor elements $MR_1 \ldots MR_4$ are in parallel with respect to the incoming radiation.

Optical separation device 306 is any device used to separate electromagnetic radiation 310 into component wavelengths, such as, for example, a diffraction grating or spectral splitting element. A diffraction grating uses the principal of diffraction to split light into its component wavelengths, while a spectral splitting element uses refraction (such as prisms, for example) or can use specially designed bandpass filters or notch filters, ring resonators etc.

During operation of calibration system 300, optical separation element 306 splits electromagnetic radiation 310 into its individual component wavelengths $310_{CW}$. Each memristor element $MR_1 \ldots MR_4$ in array 302 is fabricated such that each component wavelength $310_{CW}$ enters at least one memristor element $MR_1 \ldots MR_4$, whereby optically-interacted light 312 is produced. Each memristor element $MR_1 \ldots MR_4$ is designed to correspond to the component wavelength using any variety of techniques. For example, in certain embodiments, the diffraction grating (when used as element 306), memristor array 302 and detector array 308 are aligned such that only one wavelength or a narrow range of wavelengths enters each memristor element $MR_1 \ldots MR_4$ using, for example, nano scale positioners. Alternatively, once the light is split by the diffraction grating, waveguides may also be used to carry the split light into each memristor element $MR_1 \ldots MR_4$. In the illustrated example, optical separation device 306 transmits only one wavelength to each memristor element $MR_1 \ldots MR_4$. In other examples, however, more than one wavelength or a narrow wavelength range may be transmitted.

In order to calibrate memristor array 302 to get the desired transmission/reflection/absorption pattern, optical detector array 308 having detectors $D_1$-$D_4$ is used. In this example, each memristor element $MR_1 \ldots MR_4$ is comprised of a single memristor pixel and, therefore, detector array 308 includes a matching number of detectors. Also during calibration, as shown in FIG. 3A, processing circuitry 314 is coupled to memristor element array 302 in order to program each memristor element $MR_1 \ldots MR_4$. As used herein, calibration is the process performed to find the optical response (output light intensity) of each memristor element. In this process, a range of voltages, for example, are applied to the memristor element, and the output light intensity is measured, as shown in FIG. 2. Once the optical response has been determined, the optical response may then be programmed using, for example, a logic array programmable microchip (represented by processing circuitry 314).

Figure 3B:
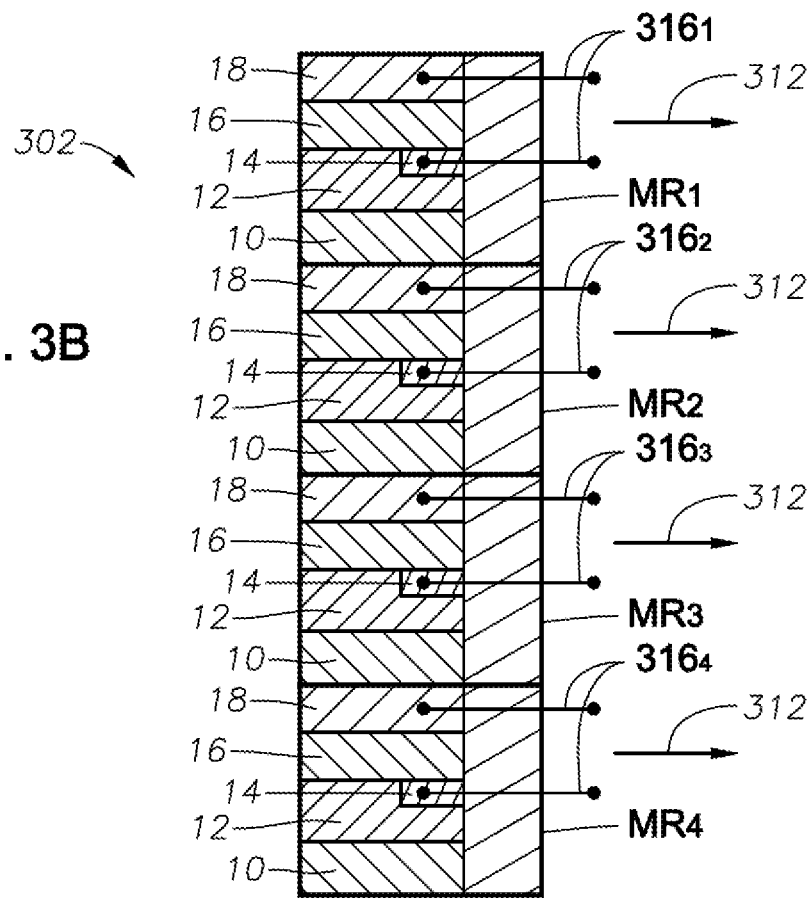
FIG. 3B is an exploded sectional view of the memristor element array of FIG. 3A.

FIG. 3B is an exploded sectional view of memristor element array 302. Unlike memristor element 100 which is arranged in parallel with electromagnetic radiation 20 (such that radiation 20 moves through layer 16 along its axis), memristor element array 302 is arranged in perpendicular to component wavelength $310_{CW}$. Alternatively, there are a variety of ways in which to deposit a memristor element without departing from the scope of this disclosure. Nevertheless, as previously described, contact(s) 14 and metal layer 18 of each memristor element $MR_1$ . . . $MR_4$ are communicably coupled to an electromagnetic field producing element (not shown) via leads $316_1$-$316_4$. In other examples, however, the electromagnetic field producing element may be communicably coupled via wireless means. Nevertheless, in this example, wire leads $316_1$-$316_4$ are communicably coupled to a voltage source acting as the electromagnetic field producing element, as well as processing circuitry 314.

Referring to FIG. 3B, in order to perform calibration of memristor array 302, electromagnetic radiation component wavelengths $310_{CW}$ optically interacts with defect ridden semiconductor layer 16. Layer 16 acts as a waveguide, attenuating the light as it passes through it, thereby producing optically-interacted light 312. In this example, a voltage source is used as the electromagnetic field producing element as previously described. Thus, when voltage is applied across defect ridden semiconductor layer 16, metal ions diffuse into layer 16 layer, thereby spectrally altering the semiconductor material in layer 16. The number of metal ions from metal layer 18 diffusing into semiconductor layer 16 increases with an increase in the power level of the electromagnetic wave(s), thus resulting in a decrease in electromagnetic radiation passing through layer 16. The amount of electromagnetic radiation 20 passing through the semiconductor layer 16 increases with a decrease in the power level of the electromagnetic wave(s). The detector (not shown) is used to measure the optical response (output light intensity) coming out of memristor element array 302, which is then utilized to program array 302 using processing circuitry 314.

Again, this phenomena occurs due to scattering and absorption effects caused by the metal ions diffused into semiconductor layer 16. By using the hysteresis curve (e.g., FIG. 2), the % transmission of light through defect ridden semiconductor layer 16 may be controlled. Once the voltage/optical transmission relationship across all wavelengths is known for memristor element array 302, array 302 can be "programmed" to achieve any transmission/reflection/absorption function. Such a method can also be used for any other electromagnetic field producing element used.

Each memristor element $MR_1$ . . . $MR_4$ is arranged in an order the desired application requires. For example, this particular example has 4 memristor pixels $MR_1$ . . . $MR_4$. However this can be extended to an 'nxn' pixel array. Moreover, the number of pixels in the horizontal and vertical direction can change with the application.

When memristor element array 302 is utilized in a desired application, each memristor element $MR_1$ . . . $MR_4$ may be communicably coupled to its own electromagnetic field producing element via leads 316 or wireless means. In certain illustrative embodiments, each electromagnetic field producing element (coupled to processing circuitry 314) may be programmed to produce electromagnetic fields having differing power levels, thereby providing the ability to alter the semiconductor layer 16 of each memristor element as desired. As a result, each memristor element $MR_1$ . . . $MR_4$ may have a different spectral property.

FIG. 4 is a block diagrammatical illustration of a memristor element array, according to an alternative embodiment of the present disclosure. In this example, memristor element array 400 includes memristor elements $MR_1$ . . . $MR_4$ arranged or fabricated in series such that array 400 emulates a traditional thin-film stack consisting of alternating high and low index materials. In this case, memristor element array 400 is fabricated using a metal layer 18, defect ridden semiconductor layer 16, leads $416_1$-$416_4$, and pure semiconductor layer 12, wherein each memristor element $MR_1$ . . . $MR_4$ is separated by a dielectric layer 10. Each memristor element $MR_1$ . . . $MR_4$ includes leads $316_1$-$316_4$, as previously described, which communicably coupled to an electromagnetic field producing element (not shown).

In this example, a voltage source is used as the electromagnetic field producing element. As broadband electromagnetic radiation 410 passes through each memristor element $MR_1$ . . . $MR_4$ in sequential fashion, radiation 410 optically interacts with each to produce optically-interacted light 412. Thus, when a varied voltage is applied across each memristor element $MR_1$ . . . $MR_4$, the ions from metal layer 18 enters defect ridden semiconductor layer 16, effectively decreasing and/or increasing the refractive index of defect ridden semiconductor layers 16. This creates a scenario of a high index material followed by low index material, which is similar to a traditional thin-film design. The number of ions diffusing into defect ridden semiconductor layer 16 is governed by the hysteresis voltage-current curve for the memristor element, as previously described. Moreover, just as in previous embodiments, each memristor element $MR_1$ . . . $MR_4$ may be communicably coupled to an electromagnetic field producing element to thereby alter the spectrally alterable material of layer 16.

FIG. 5 illustrates a spectrally programmable optical device 500, according to a generalized embodiment of the present disclosure. An electromagnetic radiation source 508 may be configured to emit or otherwise generate electromagnetic radiation 510. As understood in the art, electromagnetic radiation source 508 may be any device capable of emitting or generating electromagnetic radiation. For example, electromagnetic radiation source 508 may be a light bulb, light emitting device, laser, blackbody, photonic crystal, or X-Ray source, natural luminescence, etc. Electromagnetic radiation 510 optically interacts with memristor element 505 which may be any of the memristor elements/arrays described herein, whereby optically interacted light 512 is produced. For example, memristor element 505 may be comprised of one or many memristor pixels. Alternatively, memristor element 505 may a memristor array which includes a plurality of memristor elements, each memristor element having one or more memristor pixels.

Memristor element 505 is communicably coupled to an electromagnetic field producing element 504 via a wire leads 502. Although shown as a single electromagnetic field producing element, it may be comprised of multiple electromagnetic field producing elements when memristor element 505 includes a plurality of pixels or is an array. In such embodiments, each memristor element in the array may have its own dedicated wire leads or other suitable coupling mechanism. Alternatively, electromagnetic field producing element 504 may be communicably coupled to memristor element 505 via wireless means. Electromagnetic field producing element 504 may be a variety of devices, such as, for example, a current source, voltage source, electromagnetic source, magnetic source, thermal source or an ionic source. For example, electromagnetic field producing element 504 may be an electromagnetic field source which generates an electromagnetic wave and emits it toward memristor element 505. The electromagnetic wave will in turn induce a current across memristor element 505 which will alter the spectral properties the defect ridden semiconductor layer, as described herein.

In certain embodiments, spectrally programmable optical device 500 includes a detector, such as, for example, an optical transducer. In other embodiments, however, spectrally programmable optical device 500 will not comprise a detector and, in such cases, a human eye may serve as the detector. Applications in which the human eye acts as the detector for memristor element 505 may be, for example, architectural windows, car windows, spacecraft windows, solar front cover, solar concentrator or other applications whereby the memristor element is applied as a thin-film coating. In some of these embodiments, of course, natural luminescence may serve as the source of the electromagnetic radiation.

The spectrally programmable optical devices described herein may be utilized in a variety of other applications. Such applications may include, for example, downhole well or completion applications. Other environments may include those as diverse as those associated with surface and undersea monitoring, satellite or drone surveillance, pipeline monitoring, or even sensors transiting a body cavity such as a digestive tract. Within those applications, the spectrally programmable optical devices are utilized to detect/monitor various sample compounds or characteristics, in real time, within the environment.

The aforementioned spectrally programmable optical devices are illustrative in nature, and may be subject to a variety of other optical configurations. Such optical configurations not only include the reflection, absorption or transmission methods described herein, but can also involve scattering (Raleigh & Raman, for example) as well as emission (fluorescence, X-ray excitation, etc., for example).

Although not shown, the spectrally programmable optical devices described herein may be coupled to a remote power supply, while in other embodiments on-board batteries may be utilized. The spectrally programmable optical devices may also comprise a signal processor, communications module and other circuitry necessary to achieve the objectives of the present disclosure. It will also be recognized that the software instructions necessary to carry out the objectives of the present invention may be stored within storage located on the spectrally programmable optical devices or loaded into that storage from a CD-ROM or other appropriate storage media via wired or wireless methods.

Moreover, the memristor elements utilized in certain embodiments of the present disclosure may not be semiconductor-based. For example, plastic-based memristor elements or grapheme-based elements may also be utilized.

Embodiments described herein further relate to any one or more of the following paragraphs:

1. A spectrally programmable optical device, comprising: a memristor element comprising spectrally alterable material, the memristor element being positioned to optically interact with electromagnetic radiation to produce optically-interacted light; and an electromagnetic field produced across the memristor element to alter the spectrally alterable material, thereby altering a spectral property of the electromagnetic radiation to produce the optically-interacted light.
2. An optical device as defined in paragraph 1, further comprising an electromagnetic field producing element communicably coupled to the memristor element to produce the electromagnetic field across the memristor element.
3. An optical device as defined in paragraphs 1 or 2, wherein the electromagnetic field producing element is a current source, voltage source, electromagnetic source, magnetic source, thermal source or ionic source.
4. An optical device as defined in any of paragraphs 1-3, wherein the electromagnetic field producing element is programmable to produce different power levels.
5. An optical device as defined in any of paragraphs 1-4, wherein the memristor element comprises one or more memristor pixels.
6. An optical device as defined in any of paragraphs 1-5, wherein the memristor element is a memristor element array comprising a plurality of memristor elements.
7. An optical device as defined in any of paragraphs 1-6, wherein each memristor element is communicably coupled to an electromagnetic field producing element to thereby produce the electromagnetic field across each memristor element.
8. An optical computing device as defined in any of paragraphs 1-7, whereby each memristor element comprises a different spectral property produced by the electromagnetic field applied there across.
9. An optical device as defined in any of paragraphs 1-8, further comprising: an electromagnetic radiation source to generate the electromagnetic radiation; and an optical separation element positioned to separate the electromagnetic radiation into component wavelengths and to direct the component wavelengths to a corresponding memristor element.
10. An optical device as defined in any of paragraphs 1-9, wherein the optical separation element is a diffraction element or spectral splitting element.
11. An optical device as defined in any of paragraphs 1-10, wherein each memristor element in the memristor array corresponds to a different component wavelength of the electromagnetic radiation.
12. An optical device as defined in any of paragraphs 1-11, wherein the memristor element is a memristor element array comprising a plurality of memristor elements positioned to optically interact with the electromagnetic radiation in a sequential fashion.
13. An optical device as defined in any of paragraphs 1-12, wherein each memristor element is communicably coupled to an electromagnetic field producing element to thereby produce the electromagnetic field across each memristor element of the memristor element array.
14. An optical computing device as defined in any of paragraphs 1-13, whereby each memristor element of the memristor element array comprises a different spectral property produced by the electromagnetic field.
15. An optical device as defined in any of paragraphs 1-14, further comprising a detector positioned to detect the optically-interacted light.
16. An optical device as defined in any of paragraphs 1-15, wherein the detector comprises an optical transducer or human eye.

17. An optical device as defined in any of paragraphs 1-16, wherein the optical device comprises part of a thin-film coating or optical computing device.
18. An optical method, comprising optically interacting electromagnetic radiation with a memristor element comprising spectrally alterable material; applying an electromagnetic field across the memristor element to thereby alter the spectrally alterable material; and altering a spectral property of the electromagnetic radiation optically interacting with the memristor element to thereby produce optically-interacted light.
19. An optical method as defined in paragraph 18, wherein an electromagnetic field producing element is utilized to produce the electromagnetic field across the memristor element.
20. An optical method as defined in paragraphs 18 or 19, wherein the electromagnetic field producing element is a current source, voltage source, electromagnetic source magnetic source, thermal source or ionic source.
21. An optical method as defined in any of paragraphs 18-20, further comprising producing differing power levels of electromagnetic fields using the electromagnetic field producing element.
22. An optical method as defined in any of paragraphs 18-21, wherein: the memristor element is a memristor element array comprising a plurality of memristor elements, each memristor element being communicably coupled to an electromagnetic field producing element; and the method further comprises using the electromagnetic field producing elements to produce an electromagnetic field across each memristor element.
23. An optical method as defined in any of paragraphs 18-22, further comprising altering a spectral properties of each memristor element such that each spectral property is different.
24. An optical method as defined in any of paragraphs 18-23, further comprising: separating the electromagnetic radiation into component wavelengths; and directing the component wavelengths to a corresponding memristor element.
25. An optical method as defined in any of paragraphs 18-24, wherein: the memristor element is memristor element array comprising a plurality of memristor elements; and the method further comprises optically interacting the electromagnetic radiation with the memristor elements in sequential fashion.
26. An optical method as defined in any of paragraphs 18-25, wherein: each memristor element is communicably coupled to an electromagnetic field producing element; and the method further comprises using the electromagnetic field producing elements to produce electromagnetic fields across each memristor element.
27. An optical method as defined in any of paragraphs 18-26, further comprising using the electromagnetic fields to produce a different spectral property in each memristor element.
28. An optical method as defined in any of paragraphs 18-27, further comprising detecting the optically-interacted light.
29. An optical method as defined in any of paragraphs 18-28, wherein the optically-interacted light is detected using an optical transducer or human eye.
30. An optical method comprising optically interacting electromagnetic radiation with a memristor element to produce optically-interacted light, the memristor element comprising spectrally alterable material.
31. An optical method as defined in paragraph 30, wherein the spectrally alterable material is altered, thereby altering a spectral property of the electromagnetic radiation optically interacting with the memristor element.
32. An optical method as defined in paragraphs 30 or 31, wherein an electromagnetic field is produced across the memristor element in order to alter the spectrally alterable material.
33. An optical method as defined in any of paragraphs 30-32, wherein differing power levels of the electromagnetic field are produced across the memristor element.
34. An optical method as defined in any of paragraphs 30-33, further comprising detecting the optically-interacted light.

Although various embodiments and methodologies have been shown and described, the disclosure is not limited to such embodiments and methodologies and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A spectrally programmable optical device, comprising:
a memristor element comprising spectrally alterable material, the memristor element being positioned to optically interact with electromagnetic radiation to produce optically-interacted light; and
an electromagnetic field produced across the memristor element to alter the spectrally alterable material, thereby altering a spectral property of the electromagnetic radiation to produce the optically-interacted light.

2. An optical device as defined in claim 1, further comprising an electromagnetic field producing element communicably coupled to the memristor element to produce the electromagnetic field across the memristor element.

3. An optical device as defined in claim 2, wherein the electromagnetic field producing element is a current source, voltage source, electromagnetic source, magnetic source, thermal source or ionic source.

4. An optical device as defined in claim 2, wherein the electromagnetic field producing element is programmable to produce different power levels.

5. An optical device as defined in claim 1, wherein:
the memristor element comprises one or more memristor pixels;
the memristor element is a memristor element array comprising a plurality of memristor elements;
each memristor element of the memristor element array is communicably coupled to an electromagnetic field producing element to thereby produce the electromagnetic field across each memristor element;
each memristor element of the memristor element array comprises a different spectral property produced by the electromagnetic field applied there across; or
the memristor element is a memristor element array comprising a plurality of memristor elements positioned to optically interact with the electromagnetic radiation in a sequential fashion.

6. An optical device as defined in claim 5, further comprising:
an electromagnetic radiation source to generate the electromagnetic radiation; and an optical separation element positioned to separate the electromagnetic radiation into component wavelengths and to direct the component wavelengths to a corresponding memristor element.

7. An optical device as defined in claim 6, wherein:

the optical separation element is a diffraction element or spectral splitting element; or each memristor element in the memristor array corresponds to a different component wavelength of the electromagnetic radiation.

8. An optical device as defined in claim 1, further comprising a detector positioned to detect the optically-interacted light.

9. An optical device as defined in claim 8, wherein the detector comprises an optical transducer or human eye.

10. An optical device as defined in claim 1, wherein the optical device comprises part of a thin-film coating or optical computing device.

11. An optical method to program a memristor-based optical device, comprising:

optically interacting electromagnetic radiation with a memristor element comprising spectrally alterable material, the memristor element forming part of a memristor-based optical device;

applying an electromagnetic field across the memristor element to thereby alter the spectrally alterable material, thereby programming the memristor-based optical device; and altering a spectral property of the electromagnetic radiation optically interacting with the memristor element to thereby produce optically-interacted light.

12. An optical method as defined in claim 11, wherein an electromagnetic field producing element is utilized to produce the electromagnetic field across the memristor element.

13. An optical method as defined in claim 12, wherein:

the electromagnetic field producing element is a current source, voltage source, electromagnetic source magnetic source, thermal source or ionic source; or the method further comprises producing differing power levels of electromagnetic fields using the electromagnetic field producing element.

14. An optical method as defined in claim 11, wherein:

the memristor element is a memristor element array comprising a plurality of memristor elements, each memristor element being communicably coupled to an electromagnetic field producing element, the method further comprising using the electromagnetic field producing elements to produce an electromagnetic field across each memristor element;

the memristor element is memristor element array comprising a plurality of memristor elements, the method further comprising optically interacting the electromagnetic radiation with the memristor elements in sequential fashion; or each memristor element in the memristor element array is communicably coupled to an electromagnetic field producing element, the method further comprising using the electromagnetic field producing elements to produce electromagnetic fields across each memristor element in the memristor element array.

15. An optical method as defined in claim 14, further comprising:

altering spectral properties of each memristor element such that each spectral property is different; or separating the electromagnetic radiation into component wavelengths and directing the component wavelengths to a corresponding memristor element.

16. An optical method as defined in claim 14, further comprising using the electromagnetic fields to produce a different spectral property in each memristor element.

17. An optical method as defined in claim 11, further comprising detecting the optically-interacted light using an optical transducer or human eye.

18. An optical method comprising optically interacting electromagnetic radiation with a memristor element to produce optically-interacted light, the memristor element comprising spectrally alterable material.

19. An optical method as defined in claim 18, wherein:

the spectrally alterable material is altered, thereby altering a spectral property of the electromagnetic radiation optically interacting with the memristor element;

an electromagnetic field is produced across the memristor element in order to alter the spectrally alterable material; or differing power levels of the electromagnetic field are produced across the memristor element.

20. An optical method as defined in claim 18, further comprising detecting the optically-interacted light.

* * * * *